United States Patent
Ravi et al.

(10) Patent No.: US 8,736,384 B2
(45) Date of Patent: May 27, 2014

(54) DELAY LINE CALIBRATION

(75) Inventors: Ashoke Ravi, Hillsboro, OR (US); Ofir Degani, Haifa (IL); Hasnain Lakdawala, Beaverton, OR (US); Masoud Sajadieh, Fremont, CA (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 12/769,806

(22) Filed: Apr. 29, 2010

(65) Prior Publication Data

US 2011/0267120 A1 Nov. 3, 2011

(51) Int. Cl.
*H03L 7/095* (2006.01)

(52) U.S. Cl.
USPC ............... 331/1 A; 331/57; 331/34; 331/16; 327/156; 327/159; 327/141; 327/153

(58) Field of Classification Search
USPC .......................... 331/1 A, 16, 34, 57
See application file for complete search history.

(56) References Cited

U.S. PATENT DOCUMENTS

| | | | | |
|---|---|---|---|---|
| 5,451,894 A | * | 9/1995 | Guo | 327/241 |
| 7,688,929 B2 | * | 3/2010 | Co | 375/376 |
| 8,222,966 B2 | * | 7/2012 | Ravi et al. | 332/144 |
| 2002/0110211 A1 | * | 8/2002 | Bockelman | 375/371 |

* cited by examiner

*Primary Examiner* — Arnold Kinkead
(74) *Attorney, Agent, or Firm* — Shichrur & Co.

(57) ABSTRACT

In some embodiments, provided are calibration techniques for measuring mismatches between TDL delay stage elements, and in some cases, then compensating for the mismatches to minimize performance degradation.

20 Claims, 5 Drawing Sheets

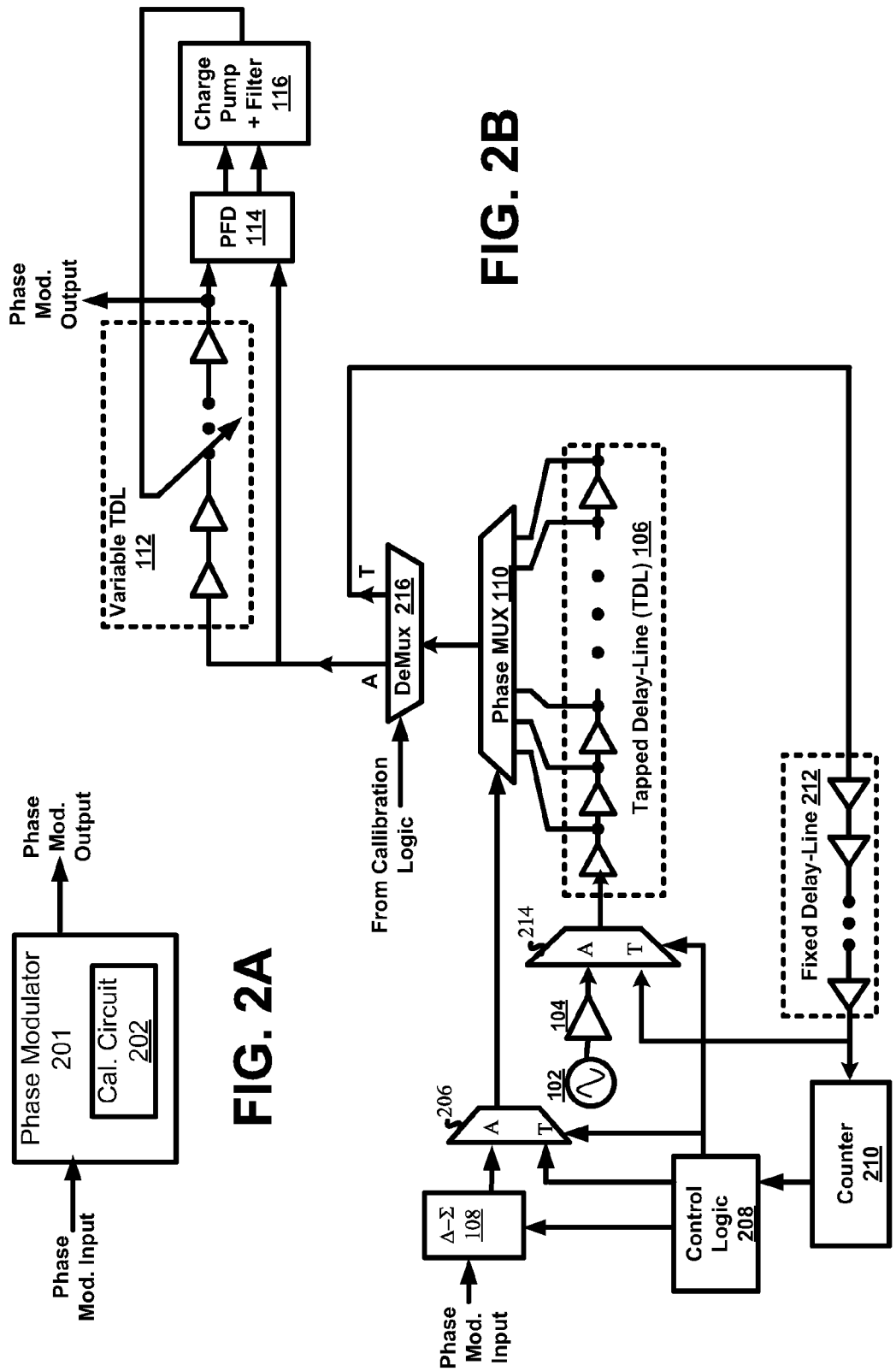

DELAY LINE CALIBRATION

BACKGROUND

Mismatch in tap delay lines (TDLs), among other things, can limit the resolution of digital frequency synthesizers and digital phase modulators. (Such devices may be used in amplifiers and transmitter circuits such as those described in U.S. Pat. No. 7,715,493, filed on Aug. 14, 2006, incorporated by reference herein.) If the mismatch between elements is not addressed, noise folding and spurs can degrade performance characteristics such as signal to noise ratio (SNR) and other performance characteristics. Accordingly, new circuits and methods for addressing delay stage errors may be desired.

BRIEF DESCRIPTION OF THE DRAWINGS

Embodiments of the invention are illustrated by way of example, and not by way of limitation, in the figures of the accompanying drawings in which like reference numerals refer to similar elements.

FIG. 2A is a diagram of a phase modulator with a calibration circuit in accordance with some embodiments.

FIG. 2B is a diagram of a more detailed implementation of the phase modulator of FIG. 2A in accordance with some embodiments.

DETAILED DESCRIPTION

In some embodiments, provided are calibration techniques for measuring mismatches between TDL delay stage elements, and in some cases, then compensating for the mismatches to minimize performance degradation.

Figure 1A:
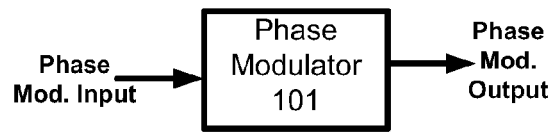
FIG. 1A is a diagram of a conventional phase modulator.

FIG. 1A generally shows a phase modulator 101 that receives a Phase Modulator input, a digital word, and generates an output frequency having a phase (e.g., between 0 and 360 degrees) based on the input Phase Modulation signal. Such a phase modulator may be used, for example, to drive a polar or out-phasing power amplifier in radio applications.

Figure 1B:
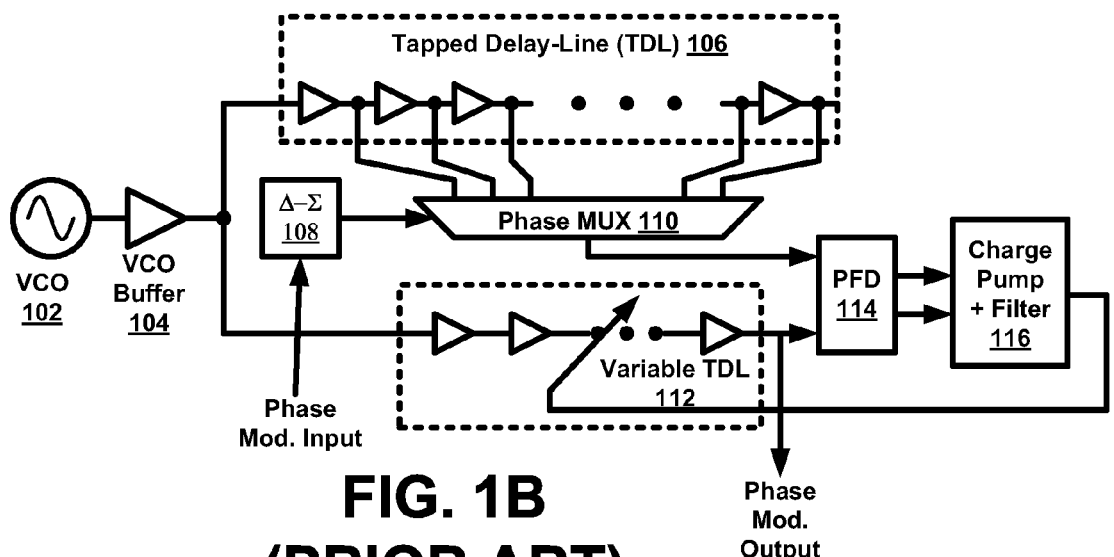
FIG. 1B is a diagram of a more detailed version of the phase modulator of FIG. 1A.

FIG. 1B shows a more detailed example of a phase modulator circuit. It comprises a voltage controlled oscillator (VCO) 102, a buffer 104, a tapped delay line (TDL) 106, a delta-sigma converter 108, a phase multiplexer 110, a variable TDL 112, a phase frequency detector (PFD) 114, and a charge pump/loop filter block 116, coupled together as shown. A Phase Modulation Input word is applied at the delta-sigma converter 108, which converts the lower frequency, larger PM word into a higher frequency, smaller word (e.g., 2 or 3 bits) for controlling the phase multiplexer 110 to select one of the delay taps from TDL 106. A signal with a frequency corresponding to that generated from VCO 102 and a phase corresponding to the selected tap is generated and provided as an input to the PFD 114.

The combination of the PFD 114, charge pump/loop filter 116, and variable TDL 112 form a delay locked loop (DLL) that converges to the frequency and phase of the signal produced from the mux. It serves to provide a buffered version of the selected phase from TDL 106.

The Delta-sigma converter 108 improves the resolution of the coarse TDL 106 by dithering between the taps in a pseudo-random sequence. When the phase modulator is used, for example, to drive a polar or out-phasing power amplifier, the Delta-sigma converter 108 may select the taps of the TDL in a time-varying manner to produce a desired signal. Unfortunately, mismatch between the delay elements of the tapped delay line results in spurs and noise and degrades the quality of the phase modulation signal and the signal-noise ratio (SNR) of the output phase modulator signal. These mismatches may result, for example, from random fluctuations in the doping and processing of wafers. Thus, disclosed in the following sections are methods and circuits for redressing such mismatches. For example, in some embodiments, a self test and calibration algorithm that can detect and measure these mismatches, e.g., on power up and compensate for them, may be provided. In some embodiments, it may be implemented in the phase modulator, and it may eliminate the need for additional tester time.

FIG. 2A generally shows a phase modulator 201 including a calibration circuit 202. The calibration circuit 202 checks delay stages in a TDL within the phase modulation circuit 201 to identify delay errors in the stages. In some embodiments, the calibration circuit 202 may also make an adjustment to compensate for the identified delay stage error. for example, filter parameters or quantizer steps (e.g., in a Delta-sigma converter) may be adjusted to compensate for the delay sage errors.

FIG. 2B shows an example of such a phase modulator with a calibration circuit in accordance with some embodiments. The circuit generally comprises phase modulator blocks from FIG. 1B, except that it incorporates different and/or additional components to implement the calibration circuit 202. In the depicted embodiment, the calibration circuit comprises control logic 208, a counter 210, and fixed delay line 212. It also incorporates 2:1 multiplexers 206 and 214, along with a 2:1 de-multiplexer 216, for selective operation in either an active ("A") mode or a test ("T") mode. When the multiplexers are controlled to select the active ("A") mode paths, the phase modulator operates normally as a phase modulator, as previously discussed, albeit this Delta-sigma converter may have been adjusted to compensate for any measured delay error. On the other hand, when the test ("T") mode multiplexer paths are selected, then the control logic 208, which in this embodiment, controls the multiplexers, can perform delay stage test and/or compensation operations.

When in test operational mode, a ring oscillator loop is created through the TDL 106 and fixed delay line 212, through multiplexer 214 and de-multiplexer 216, generating a signal with a predicted frequency of: $[\frac{1}{2}(\tau_{FIXED}+\tau_{TDL})]$, where $\tau_{FIXED}$ is the delay of the fixed delay line 212 and $\tau_{TDL}$ is the delay of the TDL at the selected tap. The control logic uses the counter to measure the frequency of the generated test signal.

On test mode initialization, a clean edge from the input clock source is fed to the TDL, and the output of the first tap of the TDL is selected, which allows the control logic 208 to determine the delay of the first delay stage. (It may simply characterize the delay based on the measured frequency, or it may actually calculate a delay value or some other value associated with the TDL tap.) Next, it selects the second TDL tap. This results in a new ring oscillator that is longer by one tap of the TDL. (Note that in the depicted embodiment, the delay elements are differential and therefore, the circuit can function as a ring oscillator regardless of whether an odd or even number of delay stages are employed.) The frequency of the ring oscillator therefore decreases. The control logic, through use of the counter, registers this new frequency. This process is repeated until all the taps have been selected.

The control logic may calculate the delay from each tap, for example, by taking the first order difference between the reciprocals of the measured ring oscillator frequencies. Once the delays have been measured, the deviation from the ideal delay can be computed and corrected.

In some embodiments, correction could be effectuated by using, e.g., a dedicated tuning circuit for each delay element. However, since this correction would typically need to be applied through a high resolution DAC of some form, it could lead to a complex implementation with a significant area overhead. Notwithstanding, tuning circuits may be used in some embodiments.

An alternative approach is to use the measured non-uniformities of the TDL steps to adjust the digital encoding of the signal that drives the TDL (e.g., the Delta-sigma converter for the depicted embodiment). In some embodiments, the TDL output may be post-processed (e.g., via synthesizers) or filtered with an appropriate transfer characteristic.

It should be appreciated that these calibration approaches may apply to any tapped delay line used for phase modulators or for time-digital conversion in frequency synthesizers (discussed below) and does not impose any restriction on the topology of the TDL. For example, the TDL can be implemented with inverter cells, buffer cells, as single-ended or differential, can use Vernier cells, coupled delay lines or any combination of these techniques.

Figure 3:
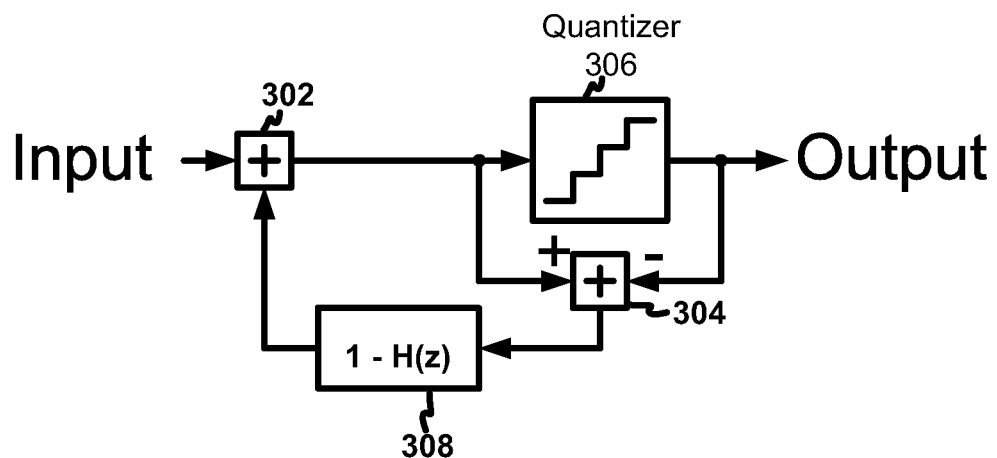
FIG. 3 is a diagram of a portion of a Delta-sigma converter in accordance with some embodiments.

FIG. 3 shows an exemplary Delta-sigma modulator (e.g., it may be all digital) that could be used for the phase modulators discussed above or for other phase modulator or frequency generator circuits. It comprises summing circuits 302, 304, quantizer 306, and filter 308, coupled as shown. In a phase modulator circuit, the Delta-sigma modulator (converter) drives the multiplexer selecting one of the coarse TDL phases to produce an edge with high resolution. The quantizer, before test/calibration operations, may have a default profile with uniform step quantization. However, after delay stage errors (mismatches or non-uniformities) have been identified, the quantizer profile may be adjusted to compensate for the mismatches. The bins of the non-uniform quantizer are centered on the identified non-uniform steps of the TDL. The non-uniform quantizer can be implemented as pure logic, and the steps can be adjusted based on the results of the calibration (test mode) process. So, if the TDL taps have mismatch and nothing in the control loop (e.g., Delta-sigma converter or filter) is modified to compensate for the mismatch, then when the low resolution output of the delta-sigma modulator drives the TDL, the resulting phase modulation experiences undesired spurs and folding of the quantization noise into the signal band. On the other hand, if the digital quantizer (which maps the input high resolution digital PM word into the low resolution output digital word) uses the non-uniform steps measured (or estimated) from the TDL to encode the PM input signal, then the spurs and noise folding are reduced, if not eliminated, and the desired signal may be protected from corruption.

(It should be appreciated that a similar technique could be applied to the output of the TDL based Time-Digital Converter in a frequency synthesizer. For example, instead of interpreting the outputs as uniformly quantized phase words, if a non-uniform quantization, based on the measured mismatch, is used as a mapped, there may be little corruption of the VCO phase and hence no significant degradation of the SNR of a utilized time-digital converter from the mismatch.)

Figure 4:
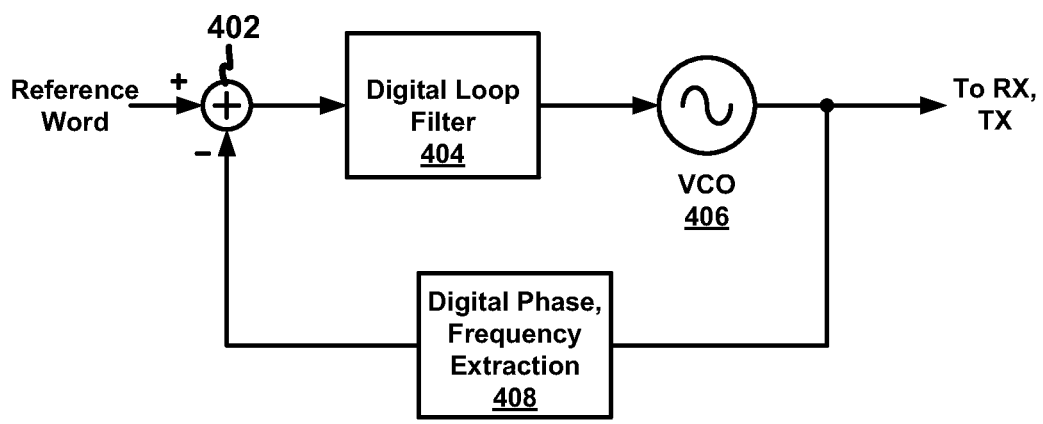
FIG. 4 is a diagram of a digital frequency synthesizer in accordance with some embodiments.

With reference to FIG. 4, a general representation of a digital frequency synthesizer is shown. it comprises a summer 402, a digital loop filter 404, a digitally controlled VCO 406, and a digital phase-frequency extraction block 408, coupled as shown. The extraction circuit 408 typically includes a time-to-digital converter (TDC) that converts the output frequency signal to a digital expression to be compared with the reference word for control of its phase and frequency. In turn, the TDC typically employs one or more tapped delay lines. By comparing a reference signal against the different taps of a TDL driven by the VCO, the phase difference between the VCO and the reference signal can be estimated digitally (time-digital conversion) and can be controlled in a PLL loop.

There are two sources of imperfection associated with the use of TDLs in digital frequency synthesizers. The first error stems from the conversion of time to phase. Since the TDL is used to digitize the phase of the VCO, the output of the TDL (which really measures delay) should be normalized to a VCO period. However, the ratio between the VCO period and the delay of each stage of the TDL is not precisely known, due to process, supply voltage and temperature variations. To solve this problem, the total delay of the TDL may be locked to the VCO period by using, for example, an auxiliary delay locked loop (DLL). An analog implementation of the DLL could track the variations to maintain lock, but this would require the use of the very same precision analog components that cut against the benefits of using a digital synthesizer. On the other hand, a digital implementation of the DLL may suffer from an error in the locked state due to quantization errors (the finite discrete steps of the digital circuitry). The presence of this error creates an error in the estimate of the ratio of the VCO period to the delay of each stage, even with the use of a DLL. This error translates to spurs in the output spectrum of the frequency synthesizer.

The second source of error is related to the variations/ mismatches between the different delay stages within the TDL. These mismatches result from random fluctuations and gradients in the doping and processing of wafers as well as from differences in the layout and associated parasitic coupling caps. Mismatch between the delay elements of a tapped delay line results in errors in the digitization of the VCO phase and causes spurs and noise in the output of the frequency synthesizer. Furthermore, mismatch accumulates along the TDL since delay from the input to the output of any stage depends on the cumulative sum of the delays of the stages before it as well. If the TDL has a very fine resolution (such as through the use of Vernier techniques), the number of stages required to span the entire VCO period increases and so does the accumulated mismatch in the line. As a result, the accumulated mismatch can limit the overall resolution of the TDL.

Accordingly, as with a phase modulator, a calibration circuit can be used to identify mismatch and effectuate appropriate compensation to reduce the inaccuracies.

Figure 5:
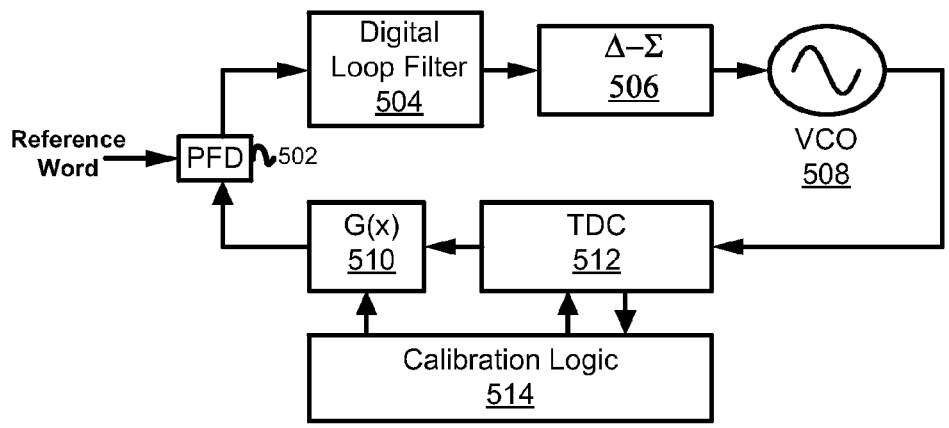
FIG. 5 is a diagram of a more detailed implementation of the digital frequency synthesizer of FIG. 4 in accordance with some embodiments.

FIG. 5 shows an embodiment of the digital frequency generator of FIG. 4. It includes a phase frequency detector (PFD) 502, functioning as a summer, a loop filter 504, a Delta-Sigma converter 506, a VCO 508, a post distortion block G(x)] 510, a time-to-digital converter (TDC) 512, and calibration logic 514. In some embodiments, the calibration logic (e.g., state machine) estimates the mismatch between delay elements in the TDC and adjusts the mapping in the post-distortion block G(x) based on the actual measured steps. This digital correction adjusts the input to the loop filter and can reduce, if not eliminate, the mismatch spurs.

Figure 6:
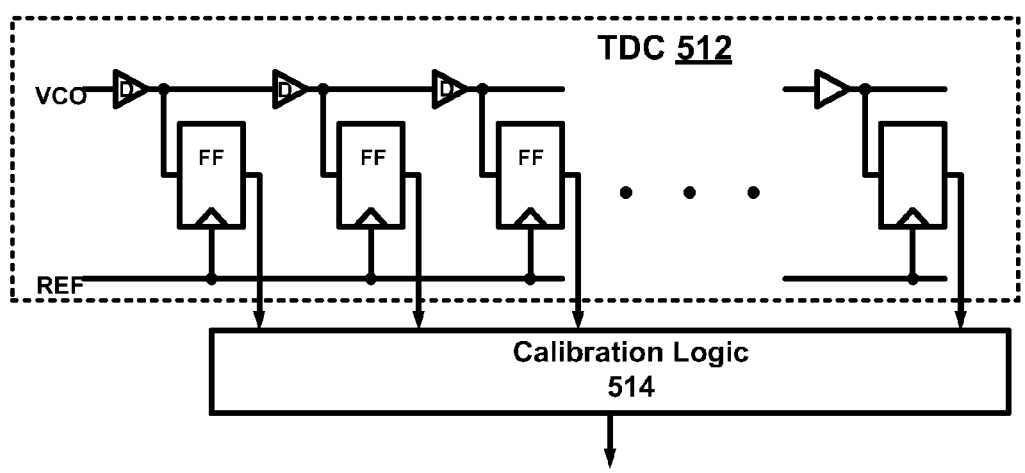
FIG. 6 is a diagram showing a TDC including a Vernier delay line in accordance with some embodiments.

The different blocks may be implemented with any suitable circuits or combinations of software and hardware. For example, the post distortion block G(x) may be implemented as a simple look-up table to implement delay stage adjustments, similar to the Delta-sigma quantizer discussed above. Along these lines, the TDC may be implemented in any suitable way. For example, FIG. 6 shows a the TDC 512 and the calibration logic 514 with the TDC 512 implemented using a Vernier delay line.

Figure 7:
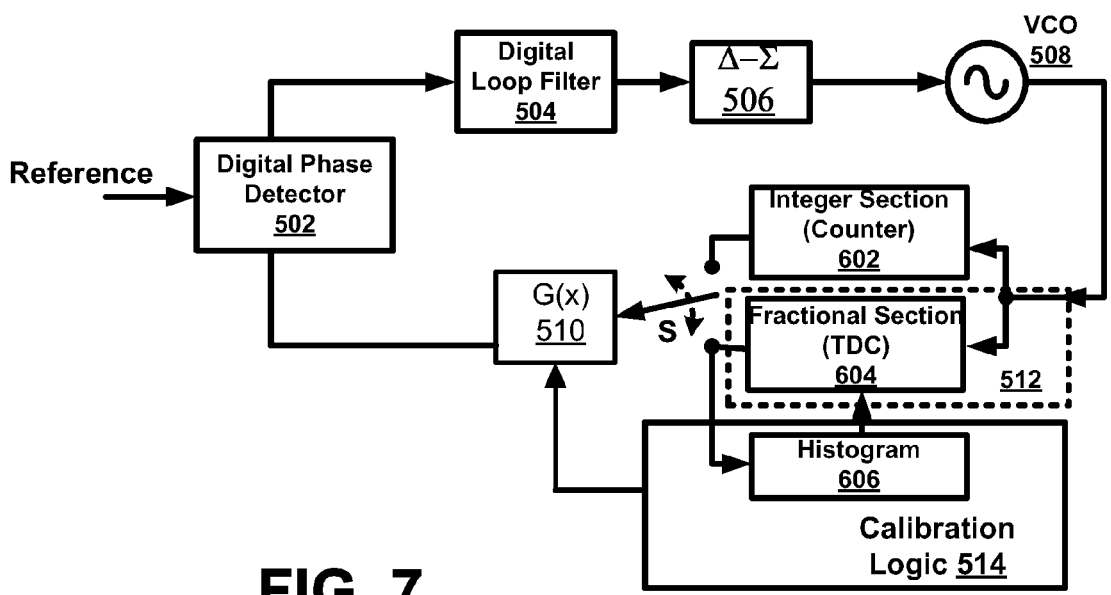
FIG. 7 is a diagram showing an implementation of the digital frequency synthesizers of FIGS. 4 and 5 in accordance with some embodiments.

FIG. 7 shows the digital frequency synthesizer of FIG. 5 in accordance with some embodiments. It includes an integer section (e.g., a counter) 602, along with the TDC 604, which functions as a fractional section. A switch S (transistor, multiplexer, etc.) is provided to switch between the integer and fractional sections. Also shown in this figure is a histogram engine 606 within the calibration logic 514. The use of these blocks will be discussed in the following description of a method for calibrating a digital synthesizer.

Initially, e.g., at power-on, the switch (S) is switched to select the integer section 602 for implementing a test mode, and the VCO frequency is locked to the reference with a ratio of (N+p/q) where N is any integer, and p and q are chosen to be relatively prime. The guidelines on selecting specific values is described a little later. Since the TDL (within the TDC) is not calibrated at this stage, the counter (integer section) 602 is selected and used as the time-digital converter, in place of the fractional section (delay stage TDC) to lock the VCO frequency to the reference.

The counter is clocked by the VCO and the count values are sampled by the reference frequency. The frequency of the VCO is extracted by taking the first order difference. The output phase noise will be relatively high with a counter since it has a coarser quantization step. However, in this calibration (test) mode, the noise can be averaged out or dithered and thus, is not so critical. Since the counter does not suffer from the mismatch of the TDL it can be used to calibrate the TDL. That is, even though the counter quantizes the VCO phase in steps of one whole VCO period, by sufficiently averaging measured values, the correct fractional frequency can be extracted. Therefore, even with a counter, the frequency resolution of the synthesizer is still limited by the number of bits in the servo control. It should be noted that for the same synthesizer loop bandwidth, the counter based time-digital converter has a higher phase noise than the TDL based time-digital converter. So, for normal active operation, the counter based approach may be unsuitable, but it may be effectively used for calibrating the TDC's TDL since, again, it does not suffer from the mismatch problem of a TDL.

While the TDL is not switched into the control lop, it is still left connected to the VCO output as a time-digital converter, and it's output is monitored by the calibration logic. If the p and q integers are relatively prime, then the VCO phase may be stepped through the phases from 0 to $2\pi$, in steps of $2\pi/q$, once every q cycles. Note that this will not necessarily be in a monotonic sequence, but it should hit every phase step equally over the observation window. If the number q is chosen to be sufficiently higher than the number of stages in the TDL, then the TDL should hit every possible output an equal number of times in the absence of mismatch. Conversely, if the TDL suffers from mismatch, then the outputs from stages with longer delays will get more hits and those from stages with shorter delays will get less hits.

By logging the histogram 606 of hits for each phase (delay tap) output, the mismatch in the TDC can be measured. The histogram, normalized to the total number of observed hits, corresponds to the delay of each stage of the TDL normalized to the VCO frequency. The accuracy of this measurement is 1/q for every q output hits analyzed if there is no noise in the system. In the presence of noise, a suitable number of blocks of q output hits should be averaged to minimize the contamination of the data from the noise. This technique therefore measures the delay of each stage of the TDL normalized to the VCO frequency in calibration mode. It therefore, not only measures the mismatch between the stages, but also, solves the time-phase conversion problem, the first of the two problems previously identified.

Once the delays have been measured, the deviation from the ideal delay can be computed and corrected. In some embodiments, this could be implemented by using a dedicated tuning circuit for each delay element. However, as noted above with regard to the phase modulator circuit, since such corrections would typically have to be applied through a high resolution DAC of some form, it may be prohibitively costly.

An alternative approach is to use the measured non-uniformity of the TDL steps to correct the digital encoding of the signal output from the TDL.

Once the delay mismatch, if any, have been measured, the calibration logic 514 can then adjust the quantization steps, e.g., within the post distortion G(x) block 510, in accordance with the measured delay deviations. (It should be appreciated that any encoding block, e.g., encoding in the Delta-Sigma converter, could alternatively or in addition to, be adjusted to compensate for the measured delay stage mismatches.) Thus, if the TDL taps have mismatch, then a digital encoder (quantizer) within the loop should use non-uniform steps corresponding to the TDL stage mismatch as measured.

Once an appropriate encoder within the loop has been adjusted in accordance with any delay mismatch to compensate for the mismatch, the fractional section (TDL) is then selected, and the digital frequency synthesizer operates in an active mode. So, in some embodiments, the afor described calibration approach can be employed, e.g., at power-up and then, the calibrated loop can operate with its adjusted settings until a next power-up (or reset) event.

In other embodiments, the calibration mode may be invoked during an active operational mode. During operation, material conditions, e.g., the temperature or supply of the device, could change. Such a change may alter the delay of each stage by a corresponding amount. Thus, the calibration method may not only be used at power-up, but also, may be employed during run-time to monitor the health of the calibration. With extra bits being used for margin, the VCO may be locked to a frequency that satisfies the relatively prime condition while still being within an allowed frequency tolerance. As the TDL is used as a time-digital converter, its histogram could continue to be monitored to determine whether the outputs have the same number of hits as during calibration. Deviations in the histogram can be used as a drift detection to trigger a re-calibration. This could be conveniently employed. For example, the "bursty" nature of wireless communications provides idle times between packets for re-calibration.

With the discussed calibration approaches, the choices for N, p and q may be chosen in the following manner. Since all of the stages of the TDL in the calibration stage should be exercised, a value for N should be chosen that will lead to the lowest necessary VCO operating frequency with some additional margin. This corresponds to the longest VCO period and thus, to the most number of TDL stages to span the period. The parameter q sets the accuracy of the mismatch measurement. Therefore the largest reasonable q should be used. Typically, in digital frequency synthesizers, the number of bits in the logic is determined by the required frequency resolution. For example, to achieve 100 Hz. resolution with a reference of 40 MHz, the servo logic would need to be implemented with $\log_2(40\times10^6/100)=19$ bits. Typically, 1-2 extra bits are used for margin. So, if a design with 21 bits is assumed, then the maximum possible q that could be used is $q=2^{21}\approx2$ million. This is significantly higher than the typical number of stages in a TDL based time-digital converter (4-256). A larger q requires more time for the calibration process, so some optimization is possible between accuracy and time required for calibration. With this choice of q, any odd number for p should satisfy the relative prime requirement.

It should be noted that this calibration technique uses the TDL in the same configuration as it is used in real measurements, except that the output of the TDL is not used in the feedback loop. Thus, the core of the TDL itself is not disturbed, which can greatly improve the accuracy of this technique. Once the calibration step is completed with a frequency ratio of $(N_{cal}+p_{cal}/q_{cal})$, the histogram simply needs to be scaled for use at any other operational frequency ratio: $(N_{oper}+P_{oper}/q_{oper})$. The scaling correction is simply $(N_{oper}+p_{oper}/q_{oper})/(N_{cal}+p_{cal}/q_{cal})$.

The disclosed calibration methods and circuits could be used to implement higher efficiency polar and out-phasing power amplifiers. These power amplifiers may be suitable for current and emerging wireless data standards such as WiFi, WiMax and 3/4G-LTE with high peak average power ratios. The higher transmitter efficiency helps improve battery life and with managing thermal issues, especially for small form-factor MID devices.

In a frequency synthesizer, moving the loop filter to a digital filter helps reduce the die area. This may be significant in a multi-radio context where more than one synthesizer is typically required to cover all bands. The disclosed calibration techniques may be beneficial for enabling the use of a time-digital converter and digital loop filter in a frequency synthesizer. The improved resolution from mismatch correction allows for the loop bandwidth to be widened, e.g., by over an order of magnitude.

In the preceding description, numerous specific details have been set forth. However, it is understood that embodiments of the invention may be practiced without these specific details. In other instances, well-known circuits, structures and techniques may have not been shown in detail in order not to obscure an understanding of the description. With this in mind, references to "one embodiment", "an embodiment", "example embodiment", "various embodiments", etc., indicate that the embodiment(s) of the invention so described may include particular features, structures, or characteristics, but not every embodiment necessarily includes the particular features, structures, or characteristics. Further, some embodiments may have some, all, or none of the features described for other embodiments.

In the preceding description and following claims, the following terms should be construed as follows: The terms "coupled" and "connected," along with their derivatives, may be used. It should be understood that these terms are not intended as synonyms for each other. Rather, in particular embodiments, "connected" is used to indicate that two or more elements are in direct physical or electrical contact with each other. "Coupled" is used to indicate that two or more elements co-operate or interact with each other, but they may or may not be in direct physical or electrical contact.

The invention is not limited to the embodiments described, but can be practiced with modification and alteration within the spirit and scope of the appended claims. For example, it should be appreciated that the present invention is applicable for use with all types of semiconductor integrated circuit ("IC") chips. Examples of these IC chips include but are not limited to processors, controllers, chip set components, programmable logic arrays (PLA), memory chips, network chips, and the like.

It should also be appreciated that in some of the drawings, signal conductor lines are represented with lines. Some may be thicker, to indicate more constituent signal paths, have a number label, to indicate a number of constituent signal paths, and/or have arrows at one or more ends, to indicate primary information flow direction. This, however, should not be construed in a limiting manner. Rather, such added detail may be used in connection with one or more exemplary embodiments to facilitate easier understanding of a circuit. Any represented signal lines, whether or not having additional information, may actually comprise one or more signals that may travel in multiple directions and may be implemented with any suitable type of signal scheme, e.g., digital or analog lines implemented with differential pairs, optical fiber lines, and/or single-ended lines.

It should be appreciated that example sizes/models/values/ranges may have been given, although the present invention is not limited to the same. As manufacturing techniques (e.g., photolithography) mature over time, it is expected that devices of smaller size could be manufactured. In addition, well known power/ground connections to IC chips and other components may or may not be shown within the FIGS, for simplicity of illustration and discussion, and so as not to obscure the invention. Further, arrangements may be shown in block diagram form in order to avoid obscuring the invention, and also in view of the fact that specifics with respect to implementation of such block diagram arrangements are highly dependent upon the platform within which the present invention is to be implemented, i.e., such specifics should be well within purview of one skilled in the art. Where specific details (e.g., circuits) are set forth in order to describe example embodiments of the invention, it should be apparent to one skilled in the art that the invention can be practiced without, or with variation of, these specific details. The description is thus to be regarded as illustrative instead of limiting.

What is claimed is:

1. A chip comprising:
   a digital phase locked loop (PLL) having a tapped delay line (TDL); and
   a calibration circuit coupled to the PLL to measure delay mismatch from the TDL and to adjust quantization steps in the PLL to compensate for the measured delay mismatch,
   wherein the calibration circuit comprises a fixed delay line to form a ring oscillator with said TDL.

2. The chip of claim 1, in which the PLL is part of a phase modulator.

3. The chip of claim 1, in which the calibration circuit comprises a counter to measure the frequency of a signal generated by said ring oscillator.

4. The chip comprising:
   a digital phase locked loop (PLL) having a tapped delay line (TDL); and
   a calibration circuit coupled to the PLL to measure delay mismatch from the TDL and to adjust quantization steps in the PLL to compensate for the measured delay mismatch, wherein the quantization is adjusted by adjusting quantization steps for a Delta-sigma converter.

5. The chip of claim 4, in which the PLL is part of a digital frequency synthesizer.

6. The chip comprising:
a digital phase locked loop (PLL) having a tapped delay line (TDL); and
a calibration circuit coupled to the PLL to measure delay mismatch from the TDL and to adjust quantization in the PLL to compensate for the measured delay mismatch,
wherein the quantization is adjusted by adjusting a post distortion filter.

7. A chip comprising:
a digital phase locked loop (PLL) having a tapped delay lined (TDL);
a calibration circuit coupled to the PLL to measure mismatch from the TDL and to adjust quantization steps in the PLL to compensate for the measured delay mismatch; and
a switch to switch between an active and a calibration mode.

8. A method, comprising:
in a calibration mode, selecting different tap options in a tapped delay line;
estimating delay mismatch for the tapped delay line; the estimating comprising measuring frequency for each tap option; and
adjusting a digital encoder in a digital PLL based on said estimated mismatch.

9. A method comprising:
in calibration mode, selecting different tap options in a tapped delay line;
estimating delay mismatch for the tapped delay line, the estimating comprises generating a histogram for the tap delay options; and
adjusting a digital encoder in a digital PLL based on said estimated mismatch.

10. The method of claim 8, in which adjusting comprises modifying steps in a digital quantizer in accordance with the estimated mismatch.

11. A method comprising:
in a calibration mode, selecting different tap options in a tapped delay line;
estimating delay mismatch for the tapped delay line; and
adjusting a digital encoder in a digital PLL based on said estimated mismatch, the adjusting comprising adjusting digital encoding in a digital filter based on the estimated mismatch.

12. A circuit, comprising:
a digital phase modulator having a delta-sigma converter coupled to control a tapped delay line (TDL);
a counter to measure the frequency of a signal formed form a ring oscillator formed from the TDL; and
a calibration circuit coupled to measure delay mismatch for the TDL.

13. A circuit comprising:
a digital phase modulator having a delta-sigma converter coupled to control a tapped delay line (TDL), the delta-signal converter including a quantizer; and
a calibration circuit coupled to measure delay mismatch for the TDL, the calibration circuit comprises logic to adjust the quantizer based on the measured delay mismatch.

14. The circuit of claim 13, wherein the calibration circuit comprises a fixed delay line to form a ring oscillator with said TDL.

15. A chip comprising:
a digital phase locked loop (PLL) having a tapped delay line (TDL), wherein the PLL is part of phase modulator; and
a calibration circuit coupled to the PLL to measure delay mismatch form the TDL and to adjust quantization steps in the PLL to compensate for the measure delay mismatch,
wherein the quantization is adjusted by adjusting quantization steps for a Delta-sigma converter.

16. The chip of claim 6 in which the PLL is part of a digital frequency synthesizer.

17. The chip of claim 7, in which the PLL is part of a digital frequency synthesizer.

18. The method of claim 9, wherein the digital PLL is part of a digital frequency synthesizer.

19. The method of claim 11, wherein the digital PLL is part of a digital frequency synthesizer.

20. The circuit of claim 12, wherein the calibration circuit is to adjust quantization steps in the digital phase modulator to compensate for the measure delay mismatch.

* * * * *

UNITED STATES PATENT AND TRADEMARK OFFICE
CERTIFICATE OF CORRECTION

| | |
|---|---|
| PATENT NO. | : 8,736,384 B2 |
| APPLICATION NO. | : 12/769806 |
| DATED | : May 27, 2014 |
| INVENTOR(S) | : Ravi et al. |

It is certified that error appears in the above-identified patent and that said Letters Patent is hereby corrected as shown below:

In the Claims

Column 8, line 61, claim 4, delete "The" and insert -- A --, therefor.

Column 8, line 65, claim 4, after "adjust" insert -- non-uniform --.

Column 9, line 1, claim 4, delete "is" and insert -- steps are to be --, therefor.

Column 9, line 5, claim 6, delete "The" and insert -- A --, therefor.

Column 9, line 10, claim 6, after "adjust" insert -- non-uniform --.

Column 9, line 10, claim 6, before "in" insert -- steps --.

Column 9, line 12, claim 6, delete "is" and insert -- steps are to be --, therefor.

Column 9, line 16, claim 7, delete "lined" and insert -- line --, therefor.

Column 9, line 17, claim 7, after "measure" insert -- delay --.

Column 9, line 18, claim 7, after "adjust" insert -- non-uniform --.

Column 9, line 23, claim 8, delete "method," and insert -- method --, therefor.

Column 9, line 26, claim 8, delete "line;" and insert -- line, --, therefor.

Column 9, line 27, claim 8, delete "each" and insert -- a --, therefor.

Column 9, line 28, claim 8, delete "option;" and insert -- option of said tap options; --, therefor.

Column 9, line 29, claim 8, after "PLL" insert -- to adjust non-uniform quantization steps in the PLL --.

Column 9, line 32, claim 9, delete "in calibration" and insert -- in a calibration --, therefor.

Column 9, line 36, claim 9, before "options" delete "delay".

Column 9, line 37, claim 9, after "PLL" insert -- to adjust non-uniform quantization steps in the PLL --.

Column 10, line 2, claim 11, after "PLL" insert -- to adjust non-uniform quantization steps in the PLL --.

Signed and Sealed this
Seventeenth Day of February, 2015

Michelle K. Lee
*Deputy Director of the United States Patent and Trademark Office*

CERTIFICATE OF CORRECTION (continued)
U.S. Pat. No. 8,736,384 B2

Column 10, line 3, claim 11, delete "comprising" and insert -- comprises --, therefor.

Column 10, line 9, claim 12, delete "form" and insert -- from --, therefor.

Column 10, line 14-15, claim 13, delete "delta-signal" and insert -- delta-sigma --, therefor.

Column 10, line 18, claim 13, delete "mismatch." and insert -- mismatch, wherein the calibration circuit comprises a fixed delay line to form a ring oscillator with said TDL. --, therefor.

Column 10, line 19-21, claim 14, delete "wherein the calibration circuit comprises a fixed delay line to form a ring oscillator with said TDL." and insert -- wherein the calibration circuit comprises a counter to measure the frequency of a signal generated by said ring oscillator. --, therefor.

Column 10, line 24, claim 15, after "of" insert -- a --.

Column 10, line 27, claim 15, delete "form" and insert -- from --, therefor.

Column 10, line 27, claim 15, after "adjust" insert -- non-uniform --.

Column 10, line 28, claim 15, delete "measure" and insert -- measured --, therefor.

Column 10, line 30, claim 15, delete "is" and insert -- steps are to be --, therefor.

Column 10, line 42, claim 20, delete "measure" and insert -- measured --, therefor.